US 8,958,262 B2

(12) United States Patent
Hwang

(10) Patent No.: US 8,958,262 B2
(45) Date of Patent: Feb. 17, 2015

(54) BANK SELECTION CIRCUIT AND MEMORY DEVICE HAVING THE SAME

(75) Inventor: Jeong-Tae Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 461 days.

(21) Appl. No.: 13/334,025

(22) Filed: Dec. 21, 2011

(65) Prior Publication Data

US 2012/0188839 A1    Jul. 26, 2012

(30) Foreign Application Priority Data

Jan. 26, 2011 (KR) .................. 10-2011-0007715

(51) Int. Cl.
  *G11C 8/00* (2006.01)
  *G11C 8/12* (2006.01)
  *G11C 8/06* (2006.01)
(52) U.S. Cl.
  CPC ... *G11C 8/12* (2013.01); *G11C 8/06* (2013.01)
  USPC ............ 365/230.06; 365/189.05; 365/230.01; 365/154
(58) Field of Classification Search
  USPC .................. 365/230.06, 230.01, 230.08
  See application file for complete search history.

(56) References Cited

U.S. PATENT DOCUMENTS

| 6,307,806 | B1 * | 10/2001 | Tomita et al. ............... 365/233.1 |
| 6,366,524 | B1 * | 4/2002 | Abedifard ................. 365/230.06 |
| 6,378,102 | B1 * | 4/2002 | Watanabe et al. ............. 714/763 |
| 2004/0047230 | A1 * | 3/2004 | Mizuhashi ..................... 365/233 |
| 2007/0086266 | A1 * | 4/2007 | Freebern et al. .......... 365/230.08 |
| 2007/0159910 | A1 * | 7/2007 | Yoshida et al. ........... 365/230.03 |
| 2008/0205187 | A1 * | 8/2008 | Pyeon ..................... 365/230.08 |
| 2009/0150635 | A1 * | 6/2009 | Shibata et al. ................ 711/167 |
| 2009/0262590 | A1 * | 10/2009 | Nakazawa ............... 365/189.14 |

FOREIGN PATENT DOCUMENTS

KR        718038 B1 *   5/2007

* cited by examiner

*Primary Examiner* — Son Dinh
*Assistant Examiner* — Uyen B Tran
(74) *Attorney, Agent, or Firm* — IP & T Group LLP

(57) ABSTRACT

A bank selection circuit includes a command latch unit configured to latch an input command at a time earlier than a rising edge of a clock by a setup time, a command decoder configured to decode a latched command and generate a row operation signal, a bank address latch unit configured to latch an input bank address at a time earlier than the rising edge of the clock by the setup time, a bank address decoder configured to decode a latched bank address and generate a bank selection signal, and a bank selection unit configured to receive the row operation signal and the bank selection signal and transfer the row operation signal to a bank selected by the bank selection signal.

5 Claims, 6 Drawing Sheets

BANK SELECTION CIRCUIT AND MEMORY DEVICE HAVING THE SAME

CROSS-REFERENCE TO RELATED APPLICATIONS

The present application claims priority of Korean Patent Application No. 10-2011-0007715, filed on Jan. 26, 2011, which is incorporated herein by reference in its entirety.

BACKGROUND

1. Field

Exemplary embodiments of the present invention relate to a bank selection circuit that increases the operation speed of a memory device, and the memory device having the same.

2. Description of the Related Art

In a system including a plurality of semiconductor devices, a memory device is used for data storage. If a memory controller such as a central processing unit (CPU) or a graphics processing unit (GPU) applies a command and an address for data input/output to the memory device, the memory device performs an operation for storing data input from the controller in a memory cell area corresponding to the input address, or the memory device performs an operation for outputting data stored in the memory cell area corresponding to the address.

FIG. 1 is a configuration diagram of a memory device including a bank selection circuit according to the conventional art, and FIG. 2 is a timing diagram illustrating the active operation of the memory device of FIG. 1. With reference to FIG. 1 and FIG. 2, an operation for activating a specific word line in the memory device and the features of the conventional art will be described.

Referring to FIG. 1, the conventional memory device includes a command latch unit 101, a command decoder 103, a delay unit 105, an address latch unit 107, a bank address decoder 109, a bank selection unit 111, and a core area 113. The core area 113 may include 8 banks (not illustrated in FIG. 1).

The command latch unit 101 is formed of a through-type latch, latches an input command CMD, and transfers a latched command CMD_LA to the command decoder 103.

The configuration of the through-type latch is illustrated in FIG. 3A. As illustrated in FIG. 3A, a pass gate 301 is turned on when a clock CLK is 'low', and the input signal CMD is directly latched and is stored until a next signal is input.

The command decoder 103 receives and decodes a latched command CMD_LA to generate an active operation signal ACT.

The delay unit 105 delays the active operation signal ACT for a designated time and transfers a delayed active operation signal ACTD to the bank selection unit 111.

The address latch unit 107 is formed of an edge trigger-type latch, and latches an address ADD, which is input together with the command CMD, at the rising edge of the clock CLK. The address ADD is divided into a bank address BA and a row address RA, and the address latch unit 107 latches the bank address BA and the row address RA. A latched bank address BA_LA is transferred to the bank address decoder 109 and a latched row address RA_LA is transferred to the core area 113.

The edge trigger-type latch is illustrated in FIG. 3B. As illustrated in FIG. 3B, a first pass gate 303 is turned on when a clock CLK is 'low', and an input signal ADD is stored in a first latch 305. Subsequently, a second pass gate 307 is turned on at the rising edge of the clock CLK, and the signal ADD is transferred to a second latch 309. Finally, a latch signal ADD_LA is stored from the rising edge of the clock CLK.

The bank address decoder 109 decodes the bank address BA to generate bank selection signals BAI<0:7>. The 8 bank selection signals BAI<0:7> correspond to the 8 banks in the core area 113, respectively.

The bank selection unit 111 receives the delayed active operation signal ACTD from the delay unit 105 and transfers the delayed active operation signal ACTD to a bank selected by the bank selection signals BAI<0:7>. 8 bank active operation signals ACT_B<0:7> output from the bank selection unit 111 correspond to the 8 banks in the core area 113, respectively.

As described above, the command latch unit 101 and the address latch unit 107 latch input signals at different timings, respectively. In detail, as illustrated in FIG. 2, the through-type command latch unit 101 latches the input command CMD at a time earlier than the rising edge of a clock CLK by a setup time tIS. Meanwhile, the edge trigger-type address latch unit 107 latches the address ADD at the rising edge of the clock CLK.

Thus, in the through-type latch, the latch timing is earlier than the edge trigger-type latch. However, since a signal synchronized with the clock CLK is not used in the through-type latch, a variation of the latch timing is large. Meanwhile, in the edge trigger-type latch, the latch time is delayed as compared with the through-type latch. However, since the edge trigger-type latch may operate in synchronization with the clock CLK, a setup/hold time is easy to adjust. In this regard, when the address is input through a plurality of pins, the edge trigger-type latch has been used because adjusting the setup/hold time is easy in consideration of a large pin variation. In addition, the delay unit 105 is further provided to delay the active operation signal ACT for a designated time in order to allow the active operation signal ACT and the bank selection signals BAI<0:7> to coincide with each other when applied to the bank selection unit 111 in consideration of the fact that the address ADD is delayed and latched as compared with the command CDM.

Due to the delay unit 105, the conventional memory device is significantly affected by PVT (process, voltage, and temperature). More specifically, when power noise occurs and a power supply voltage level is reduced, the delay amount of the delay unit 105 is significantly increased and the timings of the delayed active operation signal ACID and the bank selection signals BAI<0:7> may not coincide with each other.

To increase the operation speed of a memory device, a method for improving an AC parameter such as tRCD (RAS to CAS Delay) may be provided.

SUMMARY

An embodiment of the present invention is directed to a bank selection circuit capable of increasing the operation speed of a memory device by shortening the time until an operation corresponding to a command is performed in a core area from the application time of the command, and a bank selection circuit capable of reducing the area of the memory device, and the memory device having the same.

In accordance with an embodiment of the present invention, a bank selection circuit includes: a command latch unit configured to latch an input command at a time earlier than a rising edge of a clock by a setup time; a command decoder configured to decode a latched command and generate a row operation signal; a bank address latch unit configured to latch an input bank address at a time earlier than the rising edge of the clock by the setup time; a bank address decoder configured to decode a latched bank address and generate a bank selection signal; and a bank selection unit configured to receive the row operation signal and the bank selection signal and transfer the row operation signal to a bank selected by the bank selection signal.

In accordance with an embodiment of the present invention, a bank selection circuit includes: a command latch unit configured to latch an input command at a time earlier than a rising edge of a clock by a setup time; a command decoder configured to decode a latched command and generate a row operation signal; a bank address latch unit configured to latch a bank address of input addresses at a time earlier than the rising edge of the clock by the setup time; a row address latch unit configured to latch a row address of the input addresses at the rising edge of the clock; a bank address decoder configured to decode a latched bank address and generate a bank selection signal; a bank selection unit configured to receive the row operation signal and the bank selection signal and transfer the row operation signal to a bank selected by the bank selection signal; and a core area configured to perform an operation corresponding to the row operation signal using a latched row address in the selected bank.

DETAILED DESCRIPTION

Figure 1:
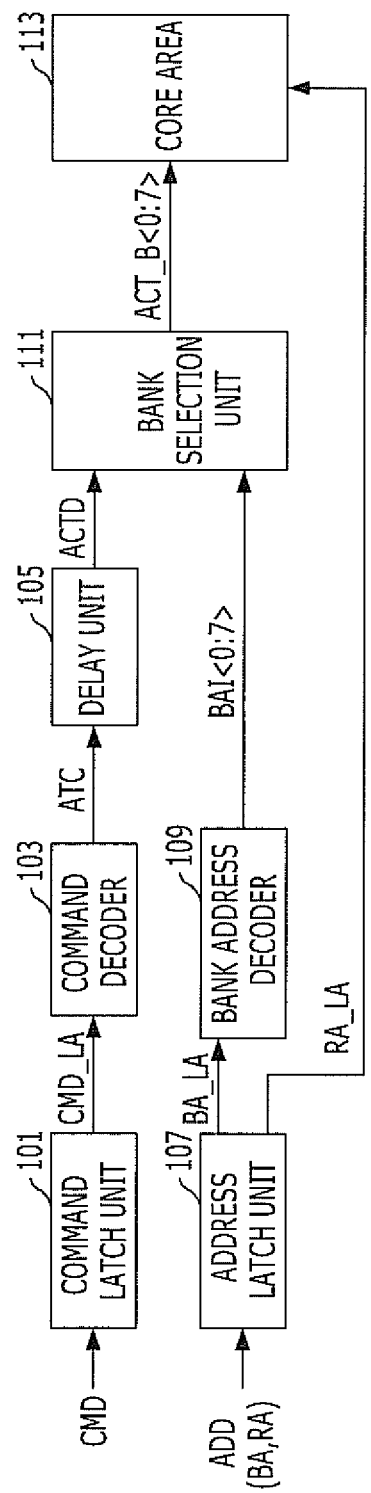
FIG. 1 is a configuration diagram of a memory device including a bank selection circuit according to the conventional art.
Figure 2:
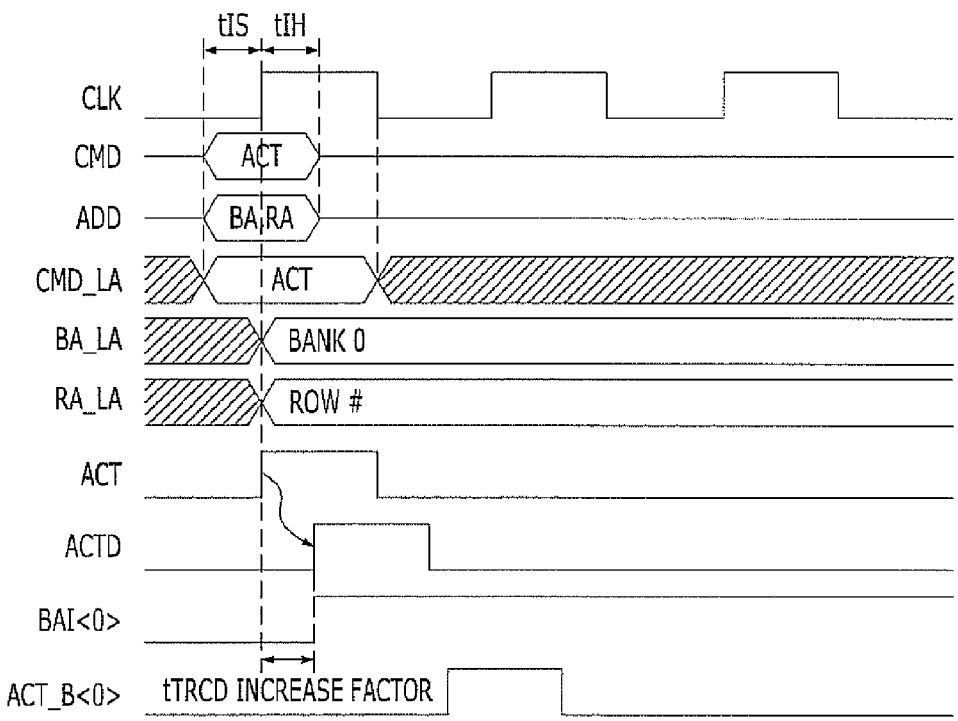
FIG. 2 is a timing diagram illustrating the active operation of a memory device of FIG. 1.
Figure 3A:
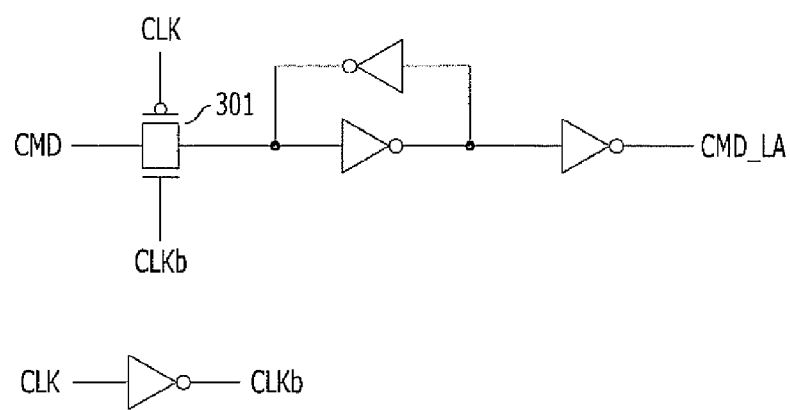
FIG. 3A is a configuration diagram of a through-type latch.
Figure 3B:
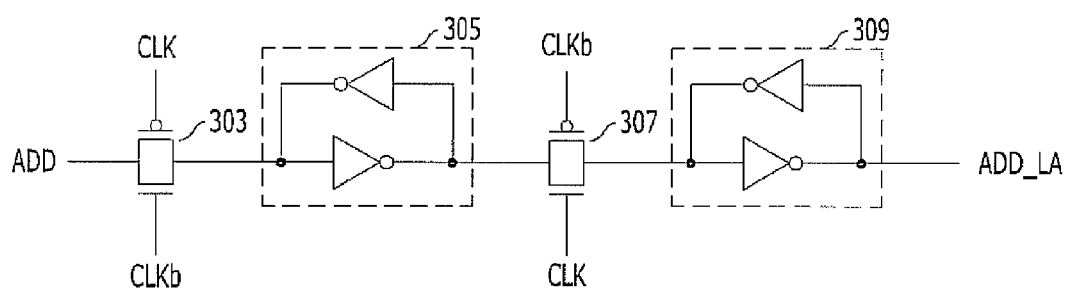
FIG. 3B is a configuration diagram of an edge trigger-type latch.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
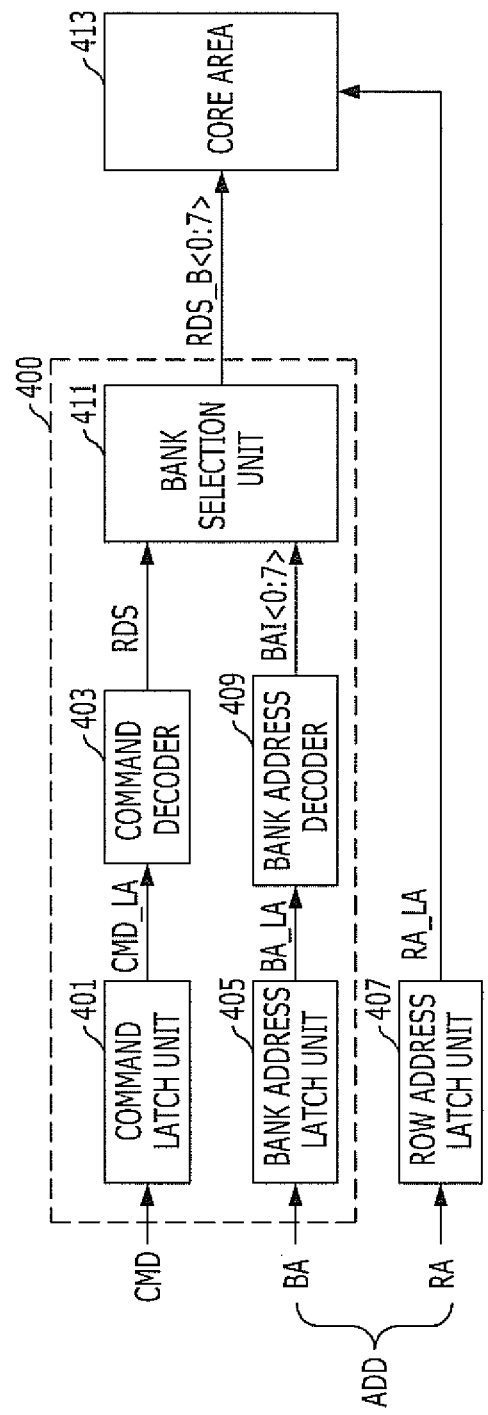
FIG. 4 is a configuration diagram of a memory device including a bank selection circuit in accordance with an embodiment of the present invention.

FIG. 4 is a configuration diagram of a memory device including a bank selection circuit in accordance with an embodiment of the present invention.

Referring to FIG. 4, the memory device includes a command latch unit 401, a command decoder 403, a bank address latch unit 405, a row address latch unit 407, a bank address decoder 409, a bank selection unit 411, and a core area 413. The command latch unit 401 is configured to latch an input command CMD at a time earlier than the rising edge of a clock CLK by a setup time. The command decoder 403 is configured to decode a latched command CMD_LA and generate a row operation signal RDS. The bank address latch unit 405 is configured to latch a bank address BA of input address ADD at a time earlier than the rising edge of the clock CLK by a setup time. The row address latch unit 407 is configured to latch a row address RA of the input address ADD at the rising edge of the clock CLK. The bank address decoder 409 is configured to decode a latched bank address BA_LA and generate bank selection signals BAI<0:7>. The bank selection unit 411 is configured to transfer a row operation signal RDS to a bank selected by the bank selection signals BAI<0:7>. In the core area 413, an operation corresponding to row operation signals RDS_B<0:7> is performed using a latched row address RA_LA in the selected bank.

The command latch unit 401, the command decoder 403, the bank address latch unit 405, the bank address decoder 409, and the bank selection unit 411 constitute a bank selection circuit 400. The core area 413 may include 8 banks.

When a command CMD and an address ADD corresponding to the command CMD are applied to the memory device, the command CMD is input to the command latch unit 401, and the address ADD is divided into a bank address BA and a row address RA, wherein the bank address BA and the row address RA are input to the bank address latch unit 405 and the row address latch unit 407, respectively.

The command latch unit 401 is formed of a through-type latch, and the command latch unit 401 latches the input command CMD and transfers a latched command CMD_LA to the command decoder 403.

The command decoder 403 receives and decodes the latched command CMD_LA to generate the row operation signal RDS. The row operation signal RDS may include an active signal ACT or a precharge signal PCG.

In the present invention, the address latch unit 107 from the conventional art is divided into the bank address latch unit 405 and the row address latch unit 407, wherein the bank address latch unit 405 is formed of the through-type latch, and the row address latch unit is formed of an edge trigger-type latch. The bank address latch unit 405 latches the input bank address BA at a time earlier than the rising edge of the clock CLK by the setup time and transfers the latched address to the bank address decoder 409. The row address latch unit 407 latches the input row address RA from the rising edge of the clock CLK and transfers the latched address to the core area 413.

In general, the address ADD is applied to the memory device through 16 to 18 pins. In the case of the 8-bank memory of the present embodiment, only three of the pins are used to receive the bank address BA. Thus, the row address RA is latched through the edge trigger-type row address latch unit 407 similarly to the conventional art, and the setup/hold time is still easy to adjust. Furthermore, the bank address latch unit 405 is formed of the through-type latch with a high speed, so that the row operation signals RDS_B<0:7> transferred to the core area 413 are quickly generated. In this way, for example, when the row operation signal RDS is an active signal, the time until a specific word line is activated from the application time of the command CMD is shortened, and the tRCD is shortened.

The bank address decoder 409 decodes the latched bank address BA_LA to generate the bank selection signals BAI<0:7>. The 8 bank selection signals BAI<0:7> correspond to the 8 banks in the core area 413, respectively.

Since the bank address BA is quickly latched at the same time as the command CMD, the bank selection signals BAI<0:7> can be applied to the bank selection unit 411 at the same point in time as the row operation signal RDS, and the delay unit 105 for delaying the row operation signal RDS is removed. Consequently, the memory device is less affected by the PVT, the performance of the memory device can be significantly improved, and the area of the memory device can also be reduced.

The bank selection unit 411 receives the row operation signal RDS and the bank selection signals BAI<0:7> and transfers the row operation signal RDS to a bank selected by the bank selection signals BAI<0:7>. The 8 row operation signal RDS_B<0:7> output from the bank selection unit 411 correspond to the 8 banks in the core area 413, respectively.

Figure 5:
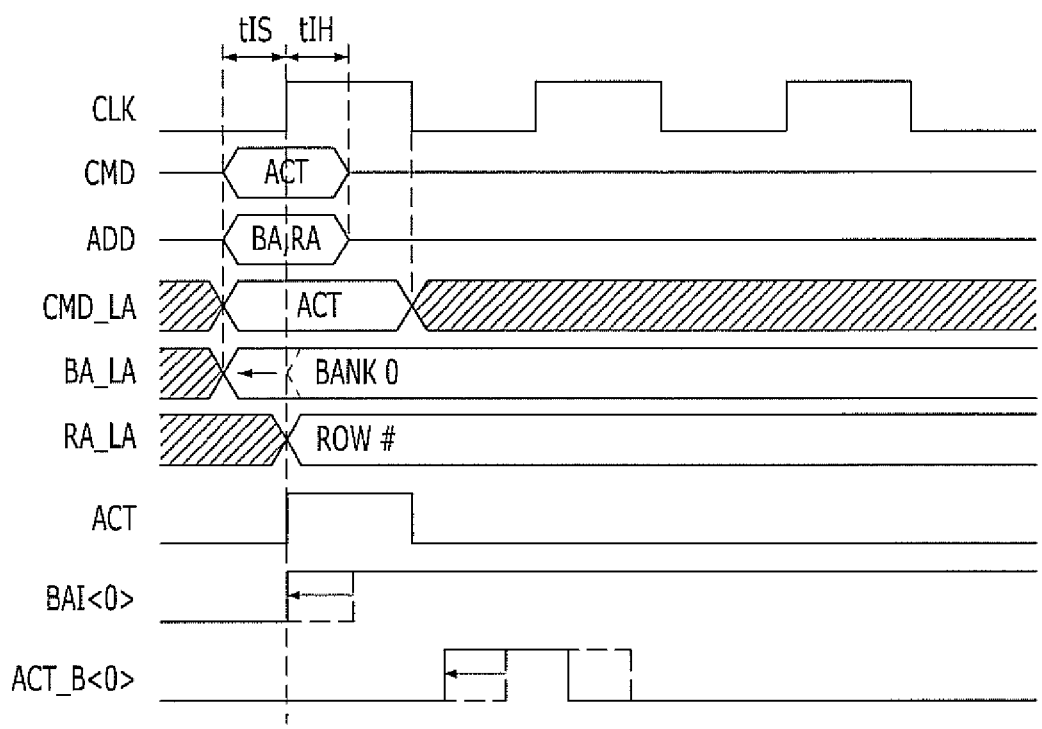
FIG. 5 is a timing diagram illustrating the active operation of a memory device of FIG. 4.

FIG. 5 is a timing diagram illustrating the active operation of the memory device of FIG. 4.

Referring to FIG. 5, the command CMD and the addresses ADD for an active operation are quickly input by the setup time tIS as compared with the rising edge of the clock CLK, wherein the command CMD is directly latched by the command latch unit 401, the bank address BA of the addresses ADD is directly latched by the bank address latch unit 405, and the row address RA of the addresses ADD is latched by the row address latch unit 407 at the rising edge of the clock CLK.

The command decoder 403 decodes the latched command CMD_LA and generates an active operation signal ACT. Since the bank address BA has been latched in the setup time tIS faster than the conventional memory device, the bank address decoder 409 decodes the latched bank address BA_LA and generates the bank selection signals BAI<0:7> in the setup time tIS faster than the conventional art. Since the latched bank address BA_LA indicates a first bank BANK0, only the first bank selection signal BAI<0> of the 8 bank selection signals BAI<0:7> is generated at a 'high' level.

Furthermore, as illustrated in FIG. 5, the first bank selection signal BAI<0> can be quickly generated and applied to the bank selection unit 411 at the same point in time as the active operation signal ACT, thereby generating a first bank active signal ACT_B<0> faster than the conventional art.

Figure 6:
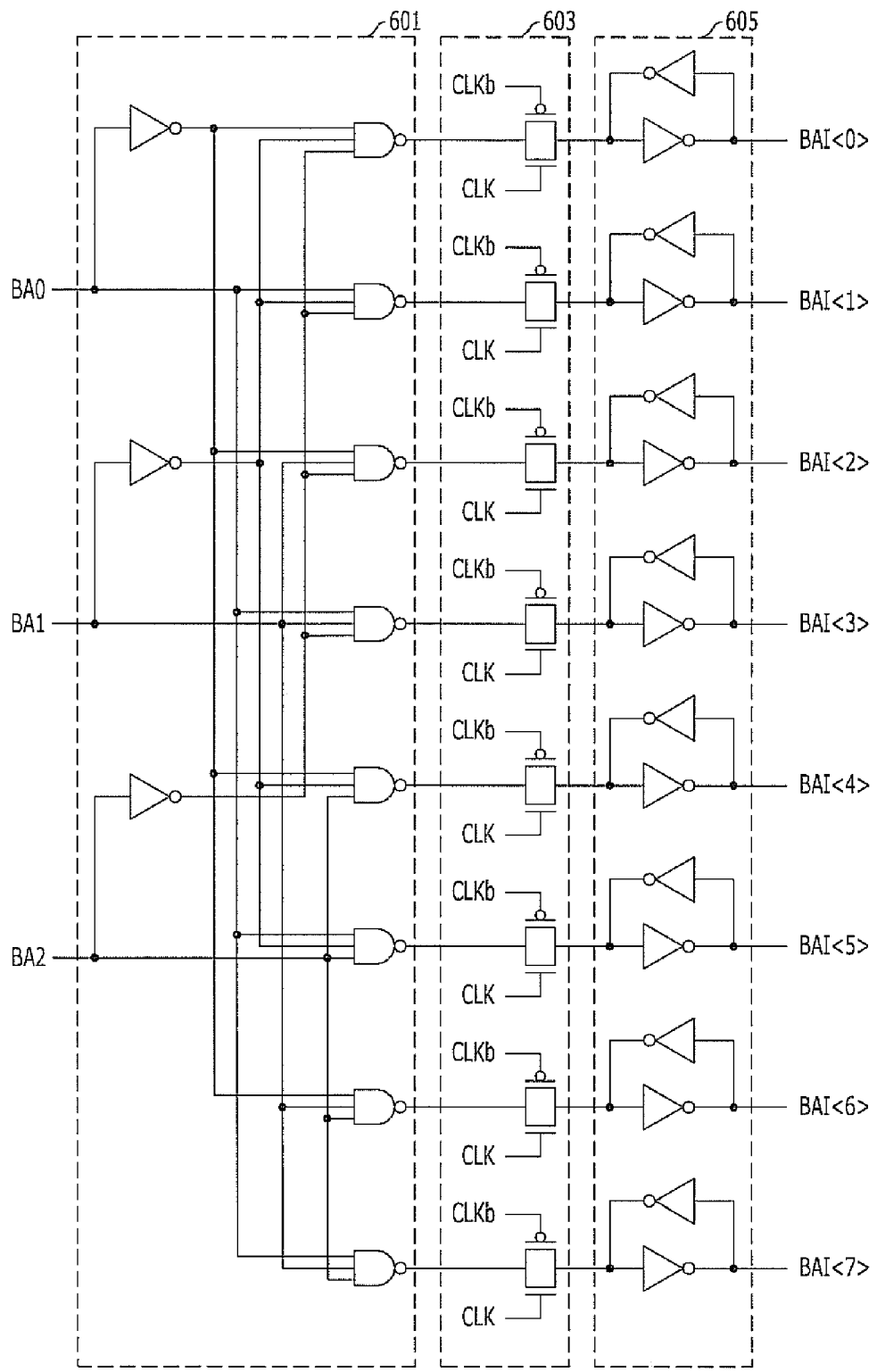
FIG. 6 is a configuration diagram of a bank address decoder 409 of FIG. 4 in accordance with an embodiment.

FIG. 6 is a configuration diagram of the bank address decoder 409 of FIG. 4 in accordance with the embodiment.

Referring to FIG. 6, the latched bank address BA_LA may include 3-bit signals BA0 to BA2, and the bank address decoder 409 includes a decoding section 601, a clock synchronization section 603, and a latch section 605. The decoding section 601 is configured to decode the 3-bit signals and generate 8 preliminary signals PREBAI<0> to PREBAI<7>. The clock synchronization section 603 is configured to transfer the preliminary signals PREBAI<0> to PREBAI<7> to the latch section 605 in synchronization with the clock CLK. The latch section 605 is configured to latch the received preliminary signals PREBAI<0> to PREBAI<7> and output the latched preliminary signals as the bank selection signals BAI<0> to BAI<7>.

Since the bank selection signals BAI<0> to BAI<7> are latched by the latch section 605, the bank selection signals BAI<0> to BAI<7> can be substantially maintained after the falling edge of the clock CLK until a new bank address is input.

Since the configurations of the decoding section 601 and the clock synchronization section 603 are well known in the art, detailed descriptions about the operation method thereof will be omitted.

According to the present invention, the operation speed of a memory device may be increased by shortening the time that the memory device receives a command and generates an operation signal for performing an operation corresponding to the command in a core area.

Furthermore, the operation signal corresponding to the command is not delayed to allow the timings of the bank selection signal and the operation signal to coincide with each other. As a result, a circuit area may be reduced by an area occupied by a delay unit, and the performance of the memory device may be improved by a reduction in the influence of PVT (process, voltage, and temperature).

While the present invention has been described with respect to the specific embodiments, it will be apparent to those skilled in the art that various changes and modifications may be made without departing from the spirit and scope of the invention as defined in the following claims.

What is claimed is:

1. A bank selection circuit comprising:
   a command latch unit configured to latch an input command at a time earlier than a rising edge of a clock by a setup time;
   a command decoder configured to decode a latched command and generate a row operation signal;
   a bank address latch unit configured to latch a bank address of input addresses at a time earlier than the rising edge of the clock by the setup time;
   a row address latch unit configured to latch a row address of the input addresses at the rising edge of the clock;
   a bank address decoder configured to decode a latched bank address and generate a bank selection signal;
   a bank selection unit configured to receive the row operation signal generated by the command decoder and the bank selection signal generated by the bank address decoder and transfer the row operation signal to a bank selected by the bank selection signal; and
   a core area configured to perform an operation corresponding to the row operation signal using a latched row address in the selected bank,
   wherein the bank address latch unit is configured to latch the bank address at a time earlier than a time when the row address latch unit latches the row address by the setup time.

2. The bank selection circuit of claim 1, wherein the command latch unit and the bank address latch unit are formed of a through-type latch.

3. The bank selection circuit of claim 1, wherein the row address latch unit is formed of an edge trigger-type latch.

4. The bank selection circuit of claim 1, wherein the bank address latch unit is configured to latch the input bank address at a time substantially equal to a time when the command latch unit latches the input command.

5. The bank selection circuit of claim 1, wherein the row operation signal includes an active or precharge signal.

* * * * *